(12) United States Patent
Kang (10) Patent No.: US 8,144,243 B2
(45) Date of Patent: Mar. 27, 2012

(54) CAMERA MODULE

(75) Inventor: Hwan Jun Kang, Hwaseong-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 276 days.

(21) Appl. No.: 12/654,547

(22) Filed: Dec. 22, 2009

(65) Prior Publication Data
US 2011/0080515 A1 Apr. 7, 2011

(30) Foreign Application Priority Data
Oct. 6, 2009 (KR) .................. 10-2009-0094647

(51) Int. Cl.
*H04N 5/225* (2006.01)
(52) U.S. Cl. ........................................ 348/374
(58) Field of Classification Search .............. 348/374, 348/373; 438/64, 55
See application file for complete search history.

(56) References Cited

U.S. PATENT DOCUMENTS

| | | | | |
|---|---|---|---|---|
| 7,422,482 B2 * | 9/2008 | Wang | ............. | 439/607.01 |
| 7,891,988 B2 * | 2/2011 | Dittmann et al. | .............. | 439/77 |
| 7,918,671 B2 * | 4/2011 | Chen et al. | ............. | 439/70 |
| 8,054,634 B2 * | 11/2011 | Seo | ............. | 361/728 |
| 2003/0218873 A1 * | 11/2003 | Eromaki et al. | ............. | 361/816 |
| 2004/0023527 A1 * | 2/2004 | Nishio et al. | ............. | 439/70 |
| 2008/0119070 A1 * | 5/2008 | Yang | ............. | 439/77 |
| 2008/0142917 A1 * | 6/2008 | Lee et al. | ............. | 257/432 |
| 2010/0091179 A1 * | 4/2010 | Murakami et al. | ............. | 348/374 |
| 2011/0096223 A1 * | 4/2011 | Fu | ............. | 348/374 |
| 2011/0141342 A1 * | 6/2011 | Ming et al. | ............. | 348/345 |

FOREIGN PATENT DOCUMENTS

| | | |
|---|---|---|
| JP | 2008-276228 | 11/2008 |
| JP | 2009-123428 | 6/2009 |

* cited by examiner

*Primary Examiner* — Jason Chan
*Assistant Examiner* — Gary C Vieaux

(57) ABSTRACT

The present invention relates to a camera module assembled by using a connector. The present invention provides a camera module including: a main substrate having an image sensor mounted on an upper surface and a connector insertion groove formed at one side of the image sensor; a plurality of connectors mounted in a row in the connector insertion groove; a housing mounted on the main substrate and having a lens barrel vertically movably coupled therein; a flexible printed circuit board mounted to surround an outer peripheral surface of the housing while being electrically connected to a lens transfer device coupled to one side of the housing; and a shield case coupled to the outer peripheral surface of the housing. Since it is possible to minimize a distance between pads which are connectable through the connector, there is an advantage of miniaturizing the camera module as a whole by size reduction of the main substrate.

22 Claims, 8 Drawing Sheets

CAMERA MODULE

CROSS-REFERENCE TO RELATED APPLICATIONS

This application claims the benefit of Korean Patent Application No. 10-2009-0094647 filed with the Korea Intellectual Property Office on Oct. 6, 2009, the disclosure of which is incorporated herein by reference.

BACKGROUND OF THE INVENTION

1. Field of the Invention

The present invention relates to a camera module assembled by using a connector, and more particularly, to a camera module capable of electrically connecting a flexible printed circuit board and a main substrate, which supply power to a lens driving actuator, through a connector.

2. Description of the Related Art

In general, a compact camera module (CCM) is manufactured in a small size and applied to various IT devices of mobile communication devices including a camera phone, a PDA, and a smart phone. Recently, the launch of devices with small camera modules has been gradually increased.

This camera module has been manufactured by using an image sensor such as a CCD or a CMOS as a main component. Images of an object are condensed by the image sensor and stored as data in a memory of a device, and the stored data are displayed as images through a display medium such as an LCD or a PC monitor in the device.

Especially, in recent times, a camera module with additional functions such as an autofocus (AF) function and a zoom function is required to meet various needs of consumers. These additional functions are obtained by embedding an actuator in the camera module to drive a lens up and down.

At this time, in the camera module with the additional functions, generally, since a high pixel image sensor is mounted on a main substrate, and various passive elements and IC chips are mounted around the image sensor, an optimal circuit design of the main substrate is important. At this time, a design of a connection portion with the main substrate for supplying power to the actuator is important.

However, as described above, since the various elements including the passive elements, as well as the image sensor are simultaneously mounted on the main substrate, there is a problem that it is very difficult to secure an electrical connection between the actuator and the main substrate, that is, design freedom of terminal connection.

Meanwhile, in case that a pitch and a size of pads for connecting the actuator to the main substrate on which the image sensor is mounted are sufficient, a wire bonding method with high mechanical bonding strength may be employed. However, it is difficult to miniaturize the camera module due to size increase of the main substrate, and there are problems of circuit failure due to the size of the pad formed on the main substrate and secondary circuit failure in assembly of a socket and the main substrate characterized in that it is mainly assembled in a socket coupling type.

In order to solve these problems, an electrical connection between the pads for connecting the actuator and the main substrate is formed by minimizing an interval between the pads and coating solder paste or conductive epoxy on a boundary between the pads, but it has been pointed that it is difficult to design a process condition for the connection between the adjacent pads and to reliably maintain stable connection quality of a connection portion between the pads. Especially, in case of the conductive epoxy, since there is a difference of mechanical strength in a bonding portion according to wettability with a surface of the pad, that is, a coating target, and a coating area, there is a disadvantage in that an additional reinforcing process is required to maintain uniform curing strength.

SUMMARY OF THE INVENTION

The present invention has been proposed in order to solve the above-described problems and it is, therefore, an object of the present invention to provide a camera module capable of obtaining an optimal design of a main substrate and forming a firm electrical connection by mounting an elastic connector in a connection portion of a flexible printed circuit board, which surrounds a housing, and the main substrate.

In accordance with an aspect of the present invention to achieve the object, there is provided a camera module including: a main substrate having an image sensor mounted on an upper surface and a connector insertion groove formed at one side of the image sensor; a plurality of connectors mounted in a row in the connector insertion groove; a housing mounted on the main substrate and having a lens barrel vertically movably coupled therein; a flexible printed circuit board mounted to surround an outer peripheral surface of the housing while being electrically connected to a lens transfer device coupled to one side of the housing; and a shield case coupled to the outer peripheral surface of the housing.

The main substrate is a ceramic substrate. A plurality of socket connection pads are formed on each side surface of the main substrate.

A plurality of pads are formed at predetermined intervals on a bottom of the connector insertion groove, and the connector is individually mounted on an upper surface of each pad. At this time, a curing agent or a molding material is injected into the connector insertion groove to firmly fix the connector.

A lens barrel in which a plurality of lenses are stacked is mounted in a center portion of the housing. A lens transfer device is mounted at one side of the housing to which the lens barrel is mounted. The flexible printed circuit board is coupled to an outer peripheral surface of the housing to supply power to the lens transfer device.

A plurality of pads may be formed in a lower portion of the flexible printed circuit board which surrounds one side surface of the housing. The connector, which projects above the main substrate, is connected to each pad formed on the flexible printed circuit board so that the main substrate and the flexible printed circuit board are electrically connected.

At this time, the pads of the flexible printed circuit board are formed in a position corresponding to a position of the connector insertion groove. It is preferable that the pads formed on the flexible printed circuit board are formed at the same interval as the pads provided in the connector insertion groove to correspond one-to-one to the pads provided in the connector insertion groove.

Meanwhile, the connector is an elastic body of which a center portion is bent. The connector includes a pad support portion and a pad contact portion which are formed to be bent at predetermined angles with respect to a center bent portion.

At this time, the pad support portion of the connector is inserted in the connector insertion groove to be supported on each pad. The pad contact portion bent from the pad support portion is in elastic contact with the pad of the flexible printed circuit board.

Therefore, it is preferable that the connector is made of an elastic material. In order to improve elastic contact force of the pad contact portion, it is preferable that the pad contact portion and the pad support portion are formed at a right angle or an acute angle with respect to the bent portion.

Further, a contact surface of the connector may be formed in an uneven structure to secure stable contact with the pad of the flexible printed circuit board. A through hole having the same shape as an outer shape may be formed in the connector to secure two or more contact portions.

And, a nickel-copper plating layer may be formed on a surface of the connector so that the connector is easily mounted in the connector insertion groove in a surface-mount manner by soldering and the like.

A through hole is formed in a center portion of an upper surface of the shield case to expose an upper portion of the lens barrel mounted to the housing. The shield case is closely coupled to an outer side of the housing. At this time, the housing and the shield case may be closely coupled by a hook projecting from a side surface of the housing.

Further, in order to expand a ground region for shielding electromagnetic interference, both sides of a lower end of one side surface of the shield case extend downward to be connected to the both connectors coupled to the main substrate.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIGS. 12 to 14 are views of another embodiment of a shield case employed in the camera module in accordance with an embodiment of the present invention, wherein

DETAILED DESCRIPTION OF THE PREFERRED EMBODIMENTS

The operation and effect and the technical constitution of a camera module in accordance with the present invention to achieve the object will be clearly understood by the following detailed description with reference to the accompanying drawings in which the preferable embodiments of the present invention are shown.

Figure 1:
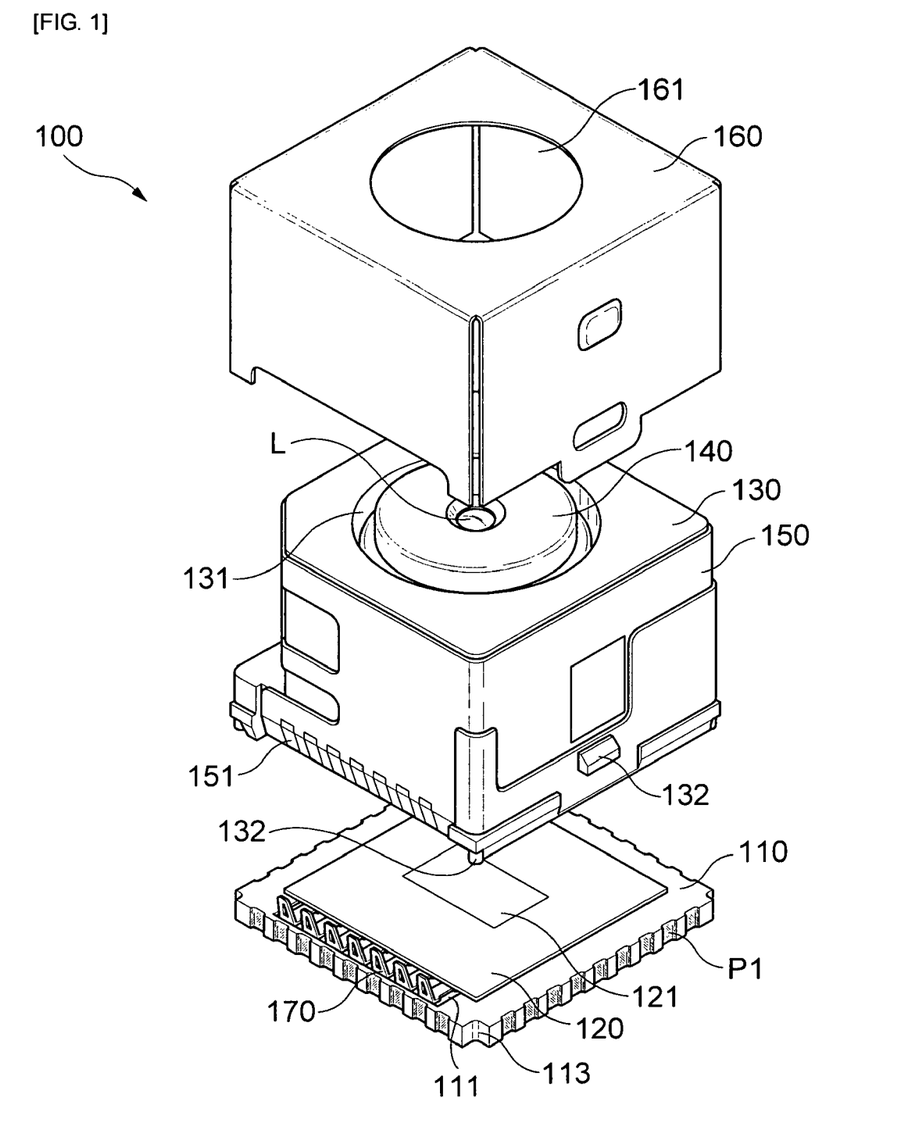
FIG. 1 is an assembly perspective view of a camera module in accordance with an embodiment of the present invention.
Figure 2:
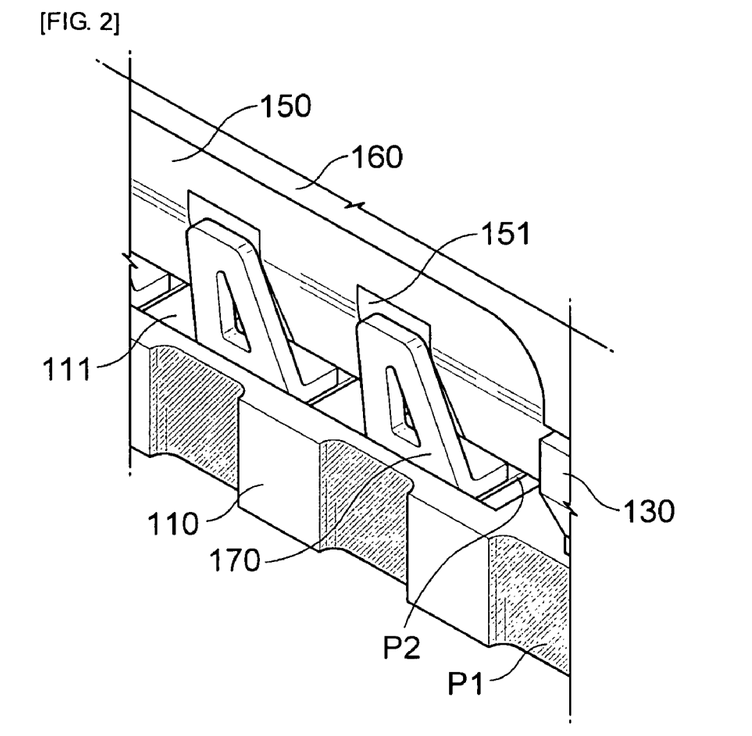
FIG. 2 is a partial magnified perspective view of the camera module in accordance with an embodiment of the present invention.
Figure 3:
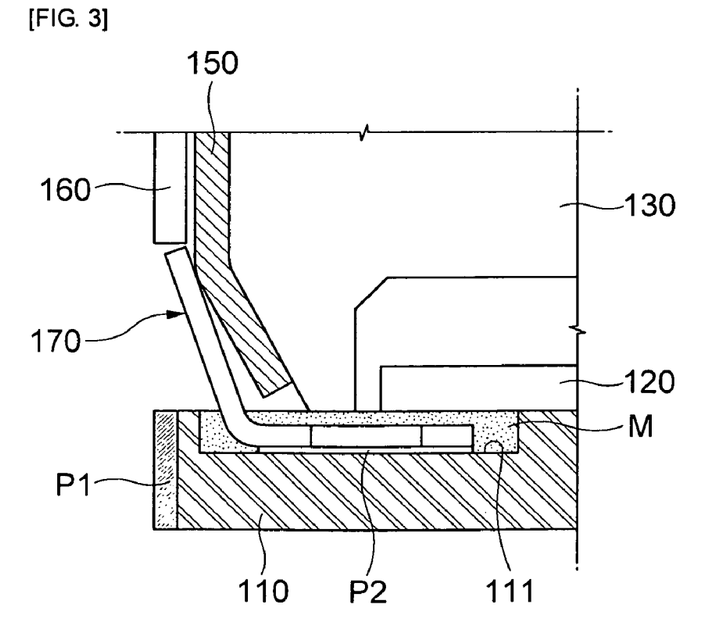
FIG. 3 is a partial magnified cross-sectional view of the camera module in accordance with an embodiment of the present invention.
Figure 4:
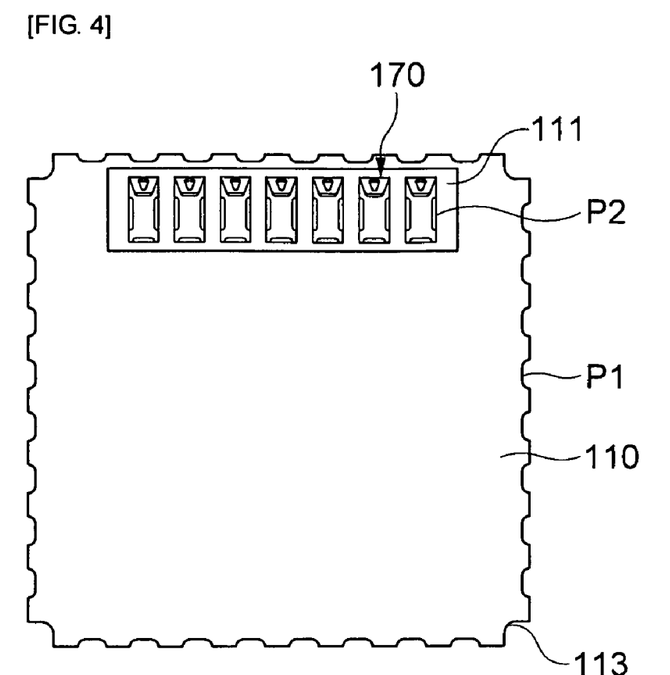
FIG. 4 is a plan view of a main substrate employed in the camera module in accordance with an embodiment of the present invention.
Figure 5:
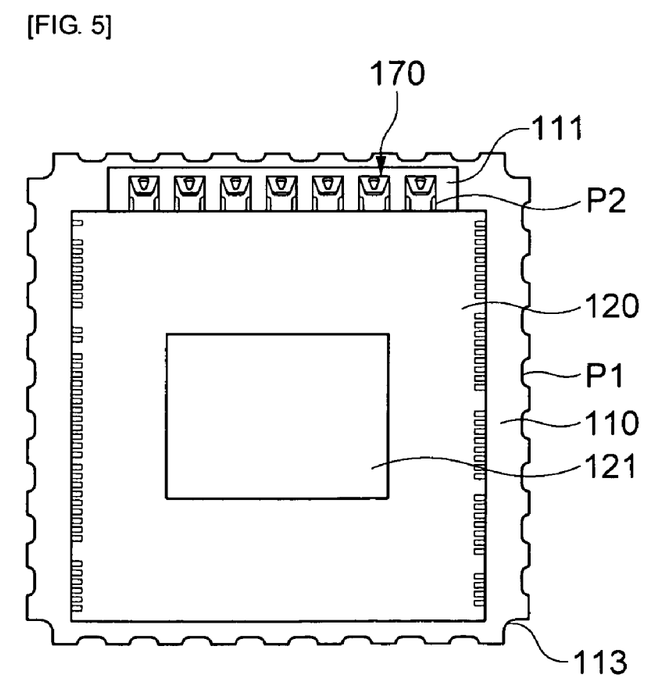
FIG. 5 is a plan view showing a state in which an image sensor is mounted on the main substrate shown in FIG. 4.

First, FIG. 1 is an assembly perspective view of a camera module in accordance with an embodiment of the present invention. FIG. 2 is a partial magnified perspective view of the camera module in accordance with an embodiment of the present invention. FIG. 3 is a partial magnified cross-sectional view of the camera module in accordance with an embodiment of the present invention. FIG. 4 is a plan view of a main substrate employed in the camera module in accordance with an embodiment of the present invention. FIG. 5 is a plan view showing a state in which an image sensor is mounted on the main substrate shown in FIG. 4.

As shown, the camera module 100 in accordance with the present embodiment includes a main substrate 110 on which an image sensor 120 is mounted, a housing 130 mounted on the main substrate 110, a lens barrel 140 vertically movably inserted in the housing 130, and a shield case 160 mounted to surround an outer peripheral surface of the housing 130 while exposing an upper surface of the lens barrel 140.

The main substrate 110 may be a rectangular plate-shaped ceramic substrate. A plurality of socket connection pads P1 are formed on each side surface of the main substrate 110. Further, a connector insertion groove 111 is formed on one edge of an upper surface of the main substrate 110. A plurality of pads P2 are arranged in a row in the connector insertion groove 111.

Further, the main substrate 110 may include a positioning groove 113 formed in each corner portion of the side surface on which the plurality of socket connection pads P1 are formed.

The image sensor 120, which receives light incident from the outside through a light receiving portion 121 formed in a center portion, converts the received light into image data, and generates images through an external display by using the converted image data, is mounted on an upper surface of the main substrate 110. As shown in FIG. 5, the image sensor 120 is mounted on the main substrate 110 to cover a portion of the connector insertion groove 111.

At this time, a plurality of connectors 170 should be mounted in the connector insertion groove 111 of the main substrate 110 before mounting the image sensor 120. The plurality of connectors 170 are mounted in a surface-mount manner to be individually connected to the plurality of pads P2 formed on a bottom of the connector insertion groove 111.

Meanwhile, the housing 130, which is coupled with the lens barrel 140, is mounted above the main substrate 110 on which the image sensor 120 is mounted. The housing 130 may be a cube having a barrel insertion groove 131 in a center portion. The lens barrel 140, where one or more lenses L are stacked, may be vertically movably mounted in the barrel insertion hole 131.

Further, a lens transfer device (not shown in the drawing) may be mounted at one side of the barrel insertion hole 131. The lens barrel 140 is moved up and down in the barrel insertion hole 131 by the lens transfer device. Autofocus (AF)

or zoom driving is performed by adjusting a distance between the lens L in the lens barrel 140 and the image sensor 120.

At this time, the lens transfer device may employ a voice coil actuator (VCA) method using electromagnetic force generated between a magnet and a coil or a piezoelectric driving method using ultrasonic driving of a piezoelectric element, besides a mechanical driving method which directly drives the lens barrel 140 up and down.

A flexible printed circuit board (FPCB) 150, that is, a power supply device for supplying power to the lens transfer device, is mounted on an outer surface of the housing 130. The FPCB 150 is coupled to surround an outer peripheral surface of the housing 130 in a state of being electrically connected to the lens transfer device. A plurality of pads 151 are formed at equal intervals at a lower end of one side surface of the FPCB 150.

The pads 151 of the FPCB 150 are formed in a position corresponding to a position of the connector insertion groove 111 of the main substrate 110. It is preferable that the pads 151 of the FPCB 150 are formed at the same interval and number as the pads P2 in the connector insertion groove 111 to correspond one-to-one to the pads P2 in the connector insertion groove 111.

When the housing 130 surrounded by the FPCB 150 is vertically coupled to the main substrate 110, the housing 130 can be mounted without a tilt with respect to an optical axis by inserting a positioning projection 132, which projects from each corner of a lower end, in the positioning groove 113 formed in the corner portion of the main substrate 110.

Further, when the housing 130 is closely coupled to the main substrate 110, the housing 130 is coupled so that the pads 151 formed at the lower end of the FPCB 150 are positioned in the connector insertion groove 111 of the main substrate 110.

That is, by connecting the plurality of pads P2 positioned in the connector insertion groove 111 of the main substrate 110 to the pads 151 of the FPCB 150 surrounding the outer peripheral surface of the housing 130, power applied through the main substrate 110 is transmitted to the lens transfer device through the FPCB 150, and the lens barrel 140 is vertically driven in the housing 130 by electrical operation of the lens transfer device.

At this time, the pads P2 in the connector insertion groove 111 should be electrically connected to the pads 151 of the FPCB 150, and an electrical connection between the pads P2 and 151 are formed by contact therebetween through the plurality of connectors 170 mounted in the connector insertion groove 111.

As shown in FIG. 2, in order to form the electrical connection between the pads P2 and 151, one side of the connector 170 is inserted in the connector insertion groove 111 formed in the main substrate 110, and the other side thereof is in contact with the pad 151 of the FPCB 150 coupled to the housing 130.

The connector 170 is formed to be bent with respect to a center portion so that a portion projecting above the connector insertion groove 111 is in elastic contact with the pad 151 of the FPCB 150. The connector 170 is individually surface-mounted on the pad P2 in the connector insertion groove 111 and bonded by soldering or fixed by injecting a separate curing agent or a molding material M into the connector insertion groove 111.

Here, detailed description of a shape and an embodiment of the connector 170 will be described below.

The shield case 160 is mounted on the outer peripheral surface of the housing 130 to shield electromagnetic interference (EMI) inside and outside the camera module 100 in a state in which the housing 130 is coupled to the main substrate 110, and the FPCB 150, which surrounds the housing 130, and the main substrate 110 are electrically connected by the connector 170.

A through hole 161 is formed on the shield case 160 to expose an upper end of the lens barrel 140 so that external light can be incident through the lens barrel 140. The external light is received at the image sensor 120 through the lens L exposed through the through hole 161.

Further, the shield case 160 may be closely coupled through a hook 132 projecting from a side surface of the housing 130.

Figure 6:
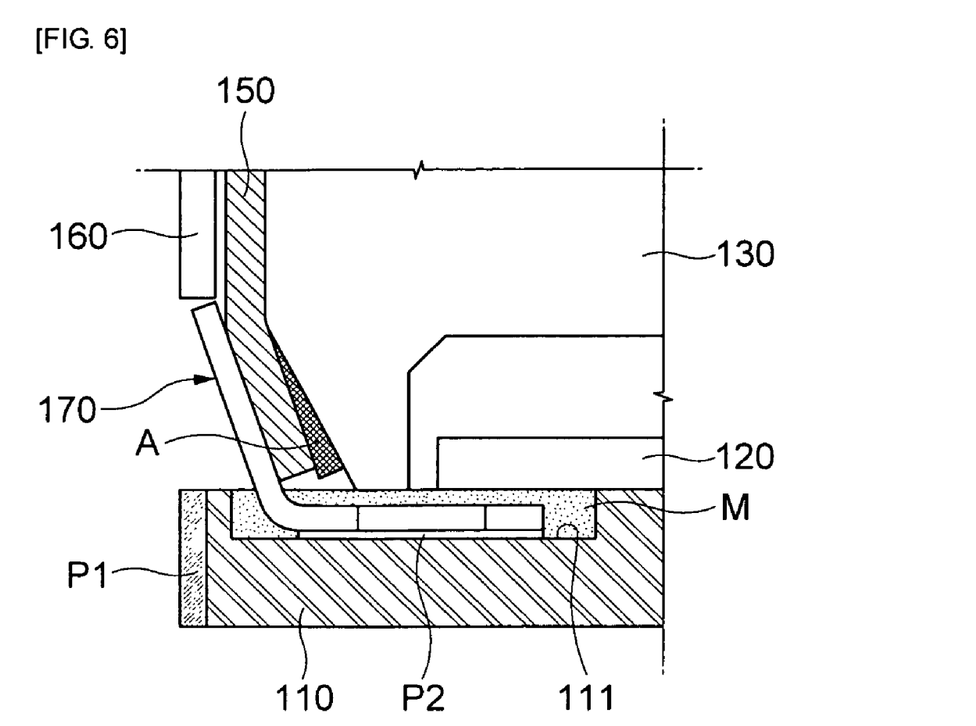
FIG. 6 is a cross-sectional view showing a state in which a buffer material is inserted between a housing and a flexible printed circuit board of the camera module in accordance with an embodiment of the present invention.

Meanwhile, FIG. 6 is a cross-sectional view showing a state in which a buffer material is inserted between the housing and the FPCB of the camera module in accordance with an embodiment of the present invention. As shown, a buffering adhesive A may be interposed in a space between the outer peripheral surface of the housing 130 and the FPCB 150 to prevent a lift therebetween when the FPCB 150 is coupled to the outer peripheral surface of the housing 130.

Accordingly, it is possible to form a stable electrical connection between the pad 151 of the FPCB 150 and the connector 170 by the entire contact therebetween.

In the camera module 100 having the above constitution in accordance with the present embodiment, as shown in the drawing, the connector 170 is mounted in an electrical connection point between the FPCB 150 and the main substrate 110 for supplying power to the lens transfer device. Since the electrical connection between the FPCB 150 and the main substrate 110 is mechanically formed through the connector 170, an electrical connection process is easily performed only by an elastic connection of the connector 170 without additional coating of a conductive adhesive or solder paste.

Further, since the present embodiment has a limitation in designing a size of the main substrate 110 due to miniaturization of the camera module 100, it is possible to improve design freedom of the electrical connection point between the FPCB 150 and the main substrate 110 when an interval between the socket connection pad P1 formed on the side surface of the main substrate 110, the pad P2 in the connector insertion groove 111, and the pad 151 formed on the FPCB 150 is minimized.

Meanwhile, the connector 170, which is an electrical connection device for supplying driving power of the lens barrel 140, will be explained in detail with reference to the above-described FIGS. 1 to 6 and below-described FIGS. 7 to 11.

Figure 7:
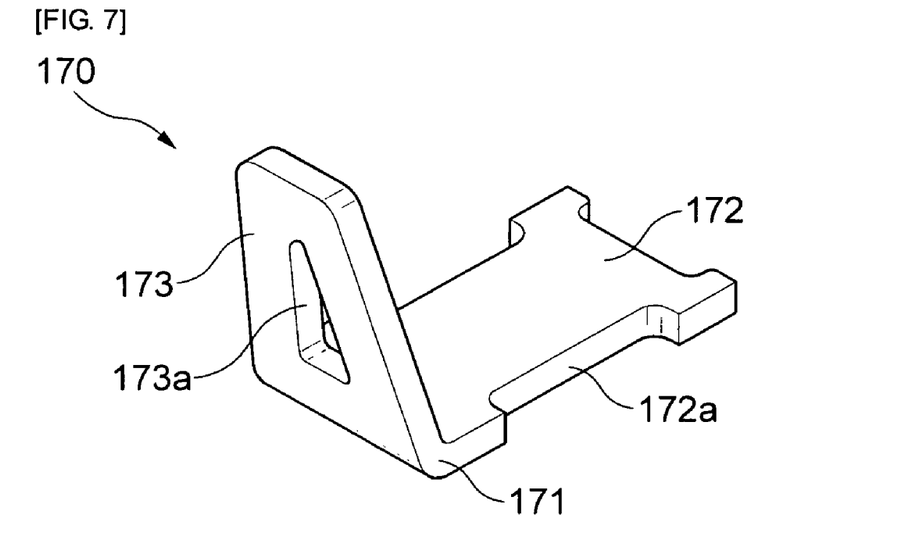
FIG. 7 is a perspective view of a connector employed in the camera module in accordance with an embodiment of the present invention.
Figure 8:
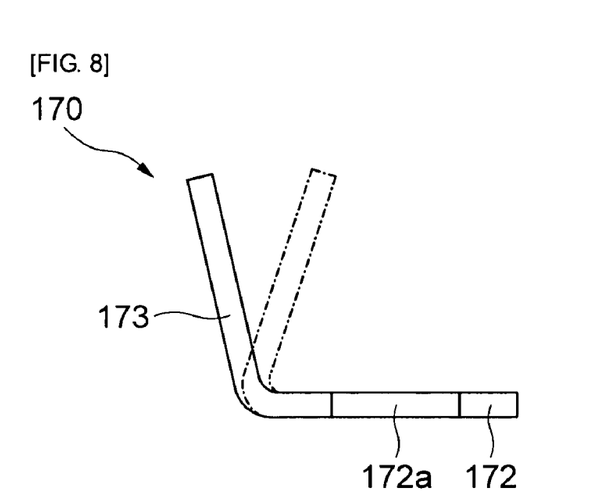
FIG. 8 is a cross-sectional view of the connector employed in the camera module in accordance with an embodiment of the present invention.
Figure 9:
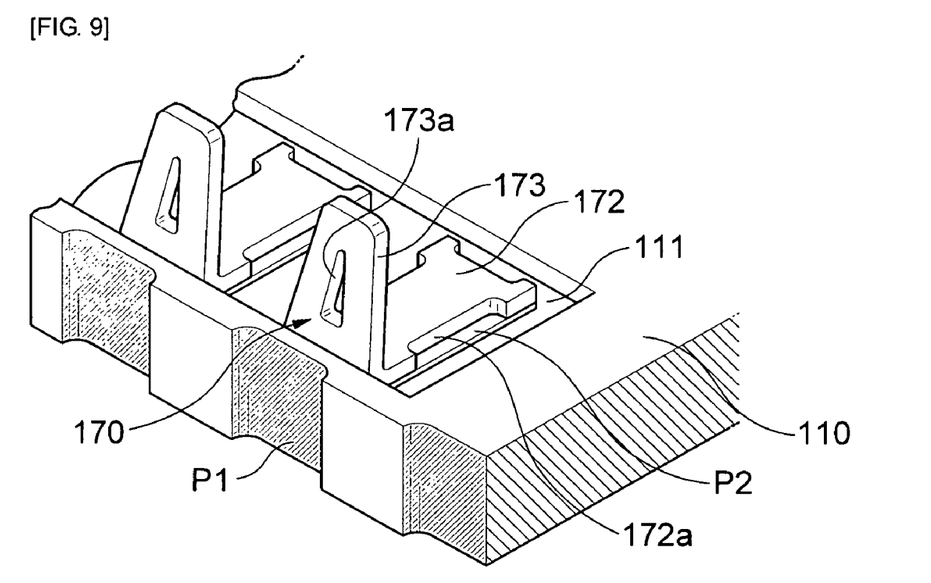
FIG. 9 is a perspective view showing a state in which the connector employed in the camera module in accordance with an embodiment of the present invention is mounted on the main substrate.

FIG. 7 is a perspective view of the connector employed in the camera module in accordance with an embodiment of the present invention. FIG. 8 is a cross-sectional view of the connector employed in the camera module in accordance with an embodiment of the present invention. FIG. 9 is a perspective view showing a state in which the connector employed in the camera module in accordance with an embodiment of the present invention is mounted on the main substrate.

As shown, the connector 170 employed in the camera module in accordance with an embodiment of the present invention is an elastic body of which a center portion is bent. The connector 170 includes a pad support portion 172 and a pad contact portion 173, which are formed to be bent at predetermined angles with respect to a center bent portion 171.

The pad support portion 172 has a plate shape with grooves 172a at both sides and is supported on an upper surface of the pad P2 in the connector insertion groove 111. The pad contact portion 173 projects upwardly from a front side of the pad support portion 172 so that an upper portion thereof comes in contact with the pad 151 of the FPCB 150, which is mounted in a position corresponding to the connection insertion groove 111.

At this time, as shown in FIG. 8, the pad support portion 172 of the connector 170 is individually mounted on each of the plurality of pads P2 aligned in a row in the connector insertion groove 111. The connector 170 may be fixed by coating solder paste on a mounting portion of the pad support portion 172.

Therefore, it is preferable that nickel-copper is plated on a surface of the connector 170 to improve coupling force between the solder paste and the connector 170. At this time, in order to improve coupling force between the pad support portion 172 and the pad P2 by soldering, the grooves 172a may be formed at the both sides of the pad support portion 172 to stably support the pad P2 through increase of a contact area of the pad support portion 172.

Further, it is preferable that the pad contact portion 173 of the connector 170 is formed to be bent at a right angle or an acute angle with respect to the pad support portion 172. This is to improve contact pressure between the connector 170 and the pad 151 of the FPCB 150 since the connector 170 is an elastic body, and thus the pad contact portion 173 is elastically movable with respect to the bent portion 171.

And, it is preferable that a through hole 173a having the same shape as an outer shape or a non-standardized shape is formed in the pad contact portion 173 in contact with the pad 151 of the FPCB 150. Two or more contact points between the pad contact portion 173 and the pad 151 of the FPCB 150 may be formed by the through hole 173a to achieve stable contact reliability.

Figure 10:
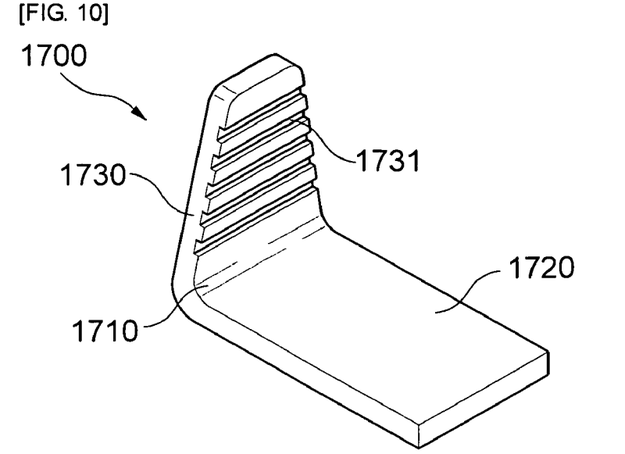
FIGS. 10 and 11 are a perspective view and a cross-sectional view of another embodiment of a connector employed in the camera module in accordance with an embodiment of the present invention.

Meanwhile, FIGS. 10 and 11 are a perspective view and a cross-sectional view of another embodiment of a connector employed in the camera module in accordance with an embodiment of the present invention. As shown, a connector 1700 of the present embodiment includes a plurality of unevenness 1731 which are formed on a contact surface of a pad contact portion 1730 projecting with respect to a bent portion 1710.

Figure 11A:
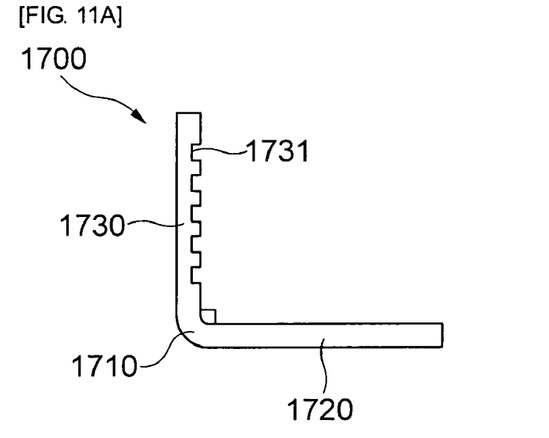
Figure 11B:
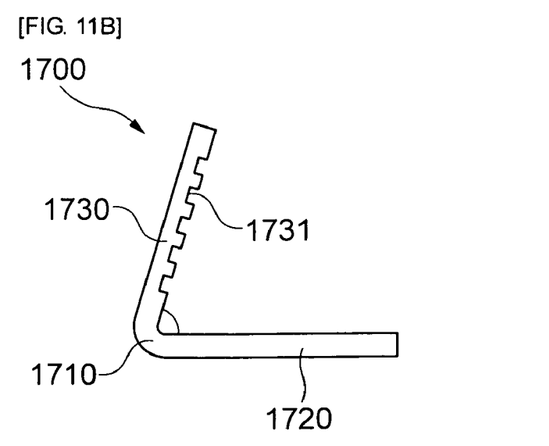

Like the connector 170 of the above-described embodiment, as shown in FIGS. 11A and 11B, the pad contact portion 1730 of the connector 1700 of the present embodiment may be formed at a right angle or an acute angle with respect to a pad support portion 1720. Stable contact reliability can be secured by expanding a contact point between the pad contact portion 1730 and the pad 151 of the FPCB 150 through the unevenness 1730 formed on the pad contact portion 1730.

Figure 12:
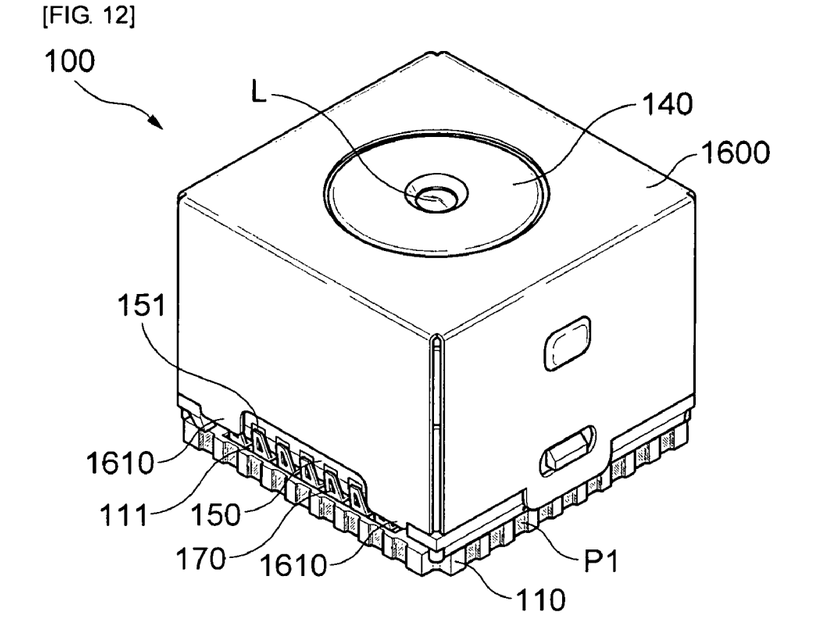
FIG. 12 is a perspective view of the camera module to which the shield case is coupled.
Figure 13:
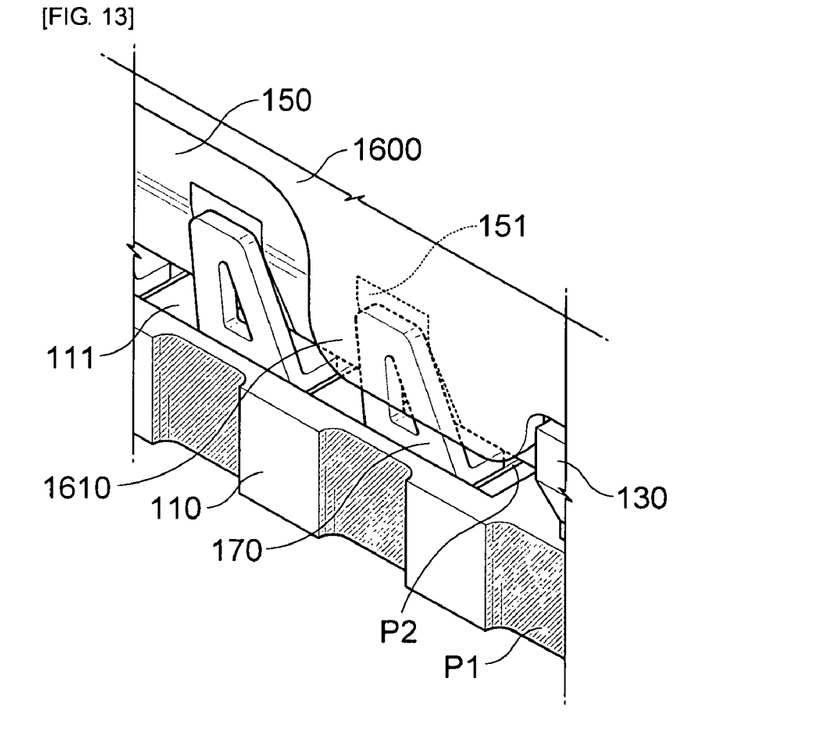
FIG. 13 is a partial magnified perspective view of the present embodiment.
Figure 14:
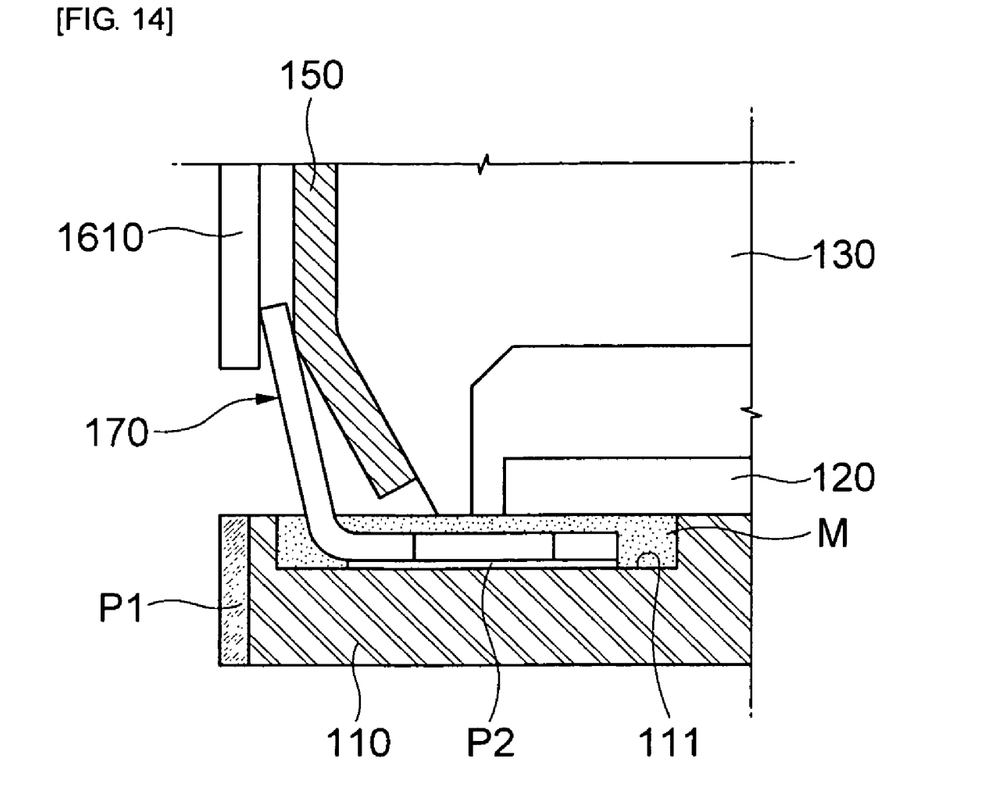
FIG. 14 is a partial magnified cross-sectional view of the present embodiment.

Further, FIGS. 12 to 14 shown below are views of another embodiment of a shield case employed in the camera module in accordance with an embodiment of the present invention. FIG. 12 is a perspective view of the camera module to which the shield case is coupled. FIG. 13 is a partial magnified perspective view of the present embodiment. FIG. 14 is a partial magnified cross-sectional view of the present embodiment.

As shown, in the camera module of the present embodiment, when the housing 130 is mounted on the main substrate 110, a shield case 1600 is mounted on an outer side of the housing 130 in a state in which the pad 151 of the FPCB 150 surrounding the housing 130 is electrically connected by the connector 170 mounted on the main substrate 110.

At this time, connector contact portions 1610 are formed in the shield case 1600 by extending downward from a side surface of a point where the FPCB 150 and the main substrate 110 are electrically connected through the connector 170. The connector contact portions 1610 may extend downward from both sides of one side surface of the shield case 1600. The extended connector contact portions 1610 are in contact with an upper end of the connector 170 which electrically connects the main substrate 110 and the FPCB 150.

The connector 170 and the shield case 1600 are electrically connected by connecting the pad P2 mounted in the connector insertion groove 111 of the main substrate 110 to a ground formed on the main substrate 110 in a circuit manner. Therefore, it is possible to improve a shielding effect of the shield case 1700 by expanding the ground to a region of the shield case 1600.

As described above, the camera module in accordance with the present invention can minimize a distance between the pads, which are connectable through the connector, by electrically connecting the FPCB and the main substrate, which apply power to the lens driving actuator coupled to the housing, through the connector. Therefore, there is an advantage of miniaturizing the camera module as a whole by side reduction of the main substrate.

Further, since the connector in accordance with the present invention is formed of an elastic body of a right angle or an acute angle, it is possible to secure the stabile contact reliability in connection of the main substrate and the FPCB and to implement a firm bonding performance without using a separate adhesive in a connection portion of the main substrate and the FPCB.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A camera module comprising:
a main substrate having an image sensor mounted on an upper surface and a connector insertion groove formed at one side of the image sensor;
a plurality of connectors mounted in a row in the connector insertion groove;
a housing mounted on the main substrate and having a lens barrel vertically movably coupled therein;
a flexible printed circuit board mounted to surround an outer peripheral surface of the housing while being electrically connected to a lens transfer device coupled to one side of the housing; and
a shield case coupled to the outer peripheral surface of the housing.

2. The camera module according to claim 1, wherein the main substrate is a ceramic substrate, and a plurality of socket connection pads are formed on each side surface of the main substrate.

3. The camera module according to claim 1, wherein a plurality of pads are formed at predetermined intervals on a bottom of the connector insertion groove, and the connector is individually mounted on an upper surface of each pad.

4. The camera module according to claim 3, wherein the connector is bonded to the pad of the connector insertion groove by soldering or fixed by injecting a curing agent or a molding material into the connector insertion groove.

5. The camera module according to claim 1, wherein a plurality of pads are formed at equal intervals in a lower portion of the flexible printed circuit board.

6. The camera module according to claim 3, wherein the main substrate and the flexible printed circuit board are electrically connected by connecting the connector, which is coupled to project above the main substrate, to each pad formed on the flexible printed circuit board.

7. The camera module according to claim 6, wherein the pads of the flexible printed circuit board are formed in a position corresponding to a position of the connector insertion groove of the main substrate at the same interval as the pads in the connector insertion groove to correspond one-to-one to the pads in the connector insertion groove.

8. The camera module according to claim 3, wherein the connector is an elastic body of which a center portion is bent, formed to be bent with respect to a center bent portion, and includes a pad support portion supported on the pad in the connector insertion groove and a pad contact portion in contact with the pad of the flexible printed circuit board.

9. The camera module according to claim 8, wherein the pad contact portion and the pad support portion of the connector form a right angle or an acute angle with respect to the bent portion.

10. The camera module according to claim 8, wherein a contact surface of the pad contact portion is formed in an uneven structure.

11. The camera module according to claim 8, wherein a through hole having the same shape as an outer shape is formed in the pad contact portion to secure two or more contact portions.

12. The camera module according to claim 8, wherein a nickel-copper plating layer is formed on a surface of the connector.

13. The camera module according to claim 1, wherein a through hole is formed in a center portion of an upper surface of the shield case to expose an upper portion of the lens barrel mounted to the housing, and the shield case is closely coupled by a hook projecting from a side surface of the housing.

14. The camera module according to claim 13, wherein connector contact portions are formed in the shield case to be connected to the connector by extending from both sides of a lower end of one side surface of the shield case.

15. The camera module according to claim 1, wherein a buffering adhesive is interposed between the housing and the flexible printed circuit board.

16. The camera module according to claim 5, wherein the main substrate and the flexible printed circuit board are electrically connected by connecting the connector, which is coupled to project above the main substrate, to each pad formed on the flexible printed circuit board.

17. The camera module according to claim 16, wherein the pads of the flexible printed circuit board are formed in a position corresponding to a position of the connector insertion groove of the main substrate at the same interval as the pads in the connector insertion groove to correspond one-to-one to the pads in the connector insertion groove.

18. The camera module according to claim 5, wherein the connector is an elastic body of which a center portion is bent, formed to be bent with respect to a center bent portion, and includes a pad support portion supported on the pad in the connector insertion groove and a pad contact portion in contact with the pad of the flexible printed circuit board.

19. The camera module according to claim 18, wherein the pad contact portion and the pad support portion of the connector form a right angle or an acute angle with respect to the bent portion.

20. The camera module according to claim 18, wherein a contact surface of the pad contact portion is formed in an uneven structure.

21. The camera module according to claim 18, wherein a through hole having the same shape as an outer shape is formed in the pad contact portion to secure two or more contact portions.

22. The camera module according to claim 18, wherein a nickel-copper plating layer is formed on a surface of the connector.

* * * * *